United States Patent
Inoue

(10) Patent No.: US 7,279,791 B2
(45) Date of Patent: Oct. 9, 2007

(54) SEMICONDUCTOR DEVICE AND METHOD OF FABRICATING THE SAME

(75) Inventor: Keishi Inoue, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/824,229

(22) Filed: Apr. 14, 2004

(65) Prior Publication Data

US 2004/0256725 A1    Dec. 23, 2004

(30) Foreign Application Priority Data

Apr. 16, 2003 (JP) ............................ P2003-111437

(51) Int. Cl.
*H01L 23/48* (2006.01)
*H01L 23/52* (2006.01)

(52) U.S. Cl. ....................................... 257/758; 257/751

(58) Field of Classification Search ................ 257/751, 257/758, 775
See application file for complete search history.

(56) References Cited

U.S. PATENT DOCUMENTS 5,880,503 A * 3/1999 Matsumoto et al. ........ 257/372

6,649,509 B1 * 11/2003 Lin et al. .................... 438/618
2003/0116852 A1 * 6/2003 Watanabe et al. ........... 257/758

* cited by examiner

*Primary Examiner*—Theresa Doan
(74) *Attorney, Agent, or Firm*—Sonnenschein Nath & Rosenthal, LLP

(57) ABSTRACT

Provides a semiconductor that enables to suppress deformation of the opening portions due to thermal expansion and contraction and to improve production yield and reliability wiring, and a method of fabricating the same. A first conductive layer and a second conductive layer are formed on a substrate. An insulation film is formed on upper surfaces of the first and second conductive layers and has a plurality of first opening portions to expose either the first or second conductive layer and a plurality of second opening portions to expose neither the first nor the second conductive layer. The second opening portions are formed between the first opening portions. A third conductive layer formed on an upper surface of the insulation film and has an electrical connection between the first and second conductive layers through the first opening portions.

4 Claims, 10 Drawing Sheets

SEMICONDUCTOR DEVICE AND METHOD OF FABRICATING THE SAME

CROSS REFERENCE TO RELATED APPLICATION

The present document is based on Japanese Priority Document JP2003-111437, filed in the Japanese Patent Office on Apr. 16, 2003, the entire contents of which being incorporated herein by reference.

BACKGROUND OF THE INVENTION

1. Field of the Invention

The present invention relates to a semiconductor device and a method of fabricating such semiconductor device, and more specifically to a semiconductor device having a multilevel interconnection for electrically connecting a plurality of conduction layers through connection holes formed in an insulation layer and a method of fabricating such a semiconductor device.

2. Description of Related Art

With the development of higher integration density and performance of LSIs (Large Scale Integrated Circuits), device dimensions are increasingly miniaturized and devices are multi-layered. In order to reduce ever increasing wiring delay due to miniature multi-layered wiring, it is necessary to scale with appropriate ratios such parameters, for example, wiring film thickness which affect wiring resistance and capacity, a film thickness between layers and a relative dielectric constant which affect wiring capacitance, and a wiring resistivity which affects wiring resistance and the like.

As for wiring materials, it is preferable to a have a lower resistivity so as to transmit electrical signals without large voltage drop. Metals like gold (Au), copper (Cu) and silver (Ag) exhibit lower resistivity than aluminum (Al) which has been widely used. It is reported that among other metals, copper has a higher melting point than aluminum and higher activation energy to cause the electro-migration phenomenon, thereby improving reliability as compared to aluminum. However, in order to use copper as miniature wiring, since there is no suitable gas to perform dry etching on the insulation film having a copper underlayer with high selectivity ratio, buried wiring is generally formed by utilizing the Damascene technique. In particular, the dual-damascene technique in which both connection holes and wiring are buried is effective from the viewpoints of expanding alignment margin in lithography and shortening fabrication processing.

Also, it is preferable that an insulation layer has a smaller relative dielectric constant in order to reduce wiring capacitance. Materials to be used are shifting to a low relative dielectric constant materials represented by allyl ether resin, SiOC and the like. However, the low relative dielectric constant materials such as allyl ether resin have lower Young's modulus than a $SiO_2$ film or $SiO_2$ film containing fluorine used in the related art, thereby providing relatively less dense films.

FIG. 10 is a diagrammatic cross section view of a part of a semiconductor device in the related art. An insulation film 2 is formed on the upper surface of a semiconductor substrate 1. Formed on a part of the upper surface of the insulation film 2 are wiring grooves in which a first conductive layer 3 and a second conductive layer 4 are formed. A diffusion protection film 5 is formed on the upper surface of the insulation film 2 on which the first conductive layer 3, and the second conductive layer 4 are formed and an insulation film 6 is formed on the upper surface of the diffusion protection film 5. A third conductive layer 8 is formed in a wiring groove which is formed on a part of the upper surface of the insulation film 6. A diffusion protection film 9 is formed on the insulation film 6 on which the third conductive layer 8 is formed. An insulation film 10 is formed on the upper surface of the diffusion protection film 9. Additionally, the first conductive layer 3, the second conductive layer 4 and the third conductive layer 8 are electrically interconnected by way of opening portions 7. It is to be noted here that the same material as the third conductive layer 8 is filled in the opening portions. The diffusion protection films 5, 9 may be eliminated depending on the layer structure and the material of the conductive layers. Device areas and device isolation areas to be formed on the semiconductor substrate 1 are not shown in the drawing.

As a method of fabricating a semiconductor device as described hereinabove, it is known to form an interlayer insulation film on a substrate, to form upper layer wiring and lower layer wiring on the substrate, to form plugs for electrically connecting the upper layer wiring and lower layer wiring, and to form poles in the interlayer insulation film adjacent to the plugs, wherein the poles are not constituting an electrically conductive path {for example, see Japanese Patent Application Publication No. 11-154679 (pages 3-7, FIG. 1-FIG. 10)}.

SUMMARY OF THE INVENTION

However, since the technique of the related art as described hereinabove uses an insulation film having low Young's modulus, a semiconductor device tends to be deformed easily because the electrically conductive layers in the direction of the longer length is extended due to thermal expansion or contraction of under high temperature environment in the fabrication process.

FIG. 11 illustrates an example of deforming wiring and interconnection portions when a semiconductor device is exposed to high temperature environment (for example, approximately 400° C.). FIG. 11 is a diagrammatic cross section view of a part of a semiconductor device of the related art and illustrates the wiring of the semiconductor device having the device configuration as shown in FIG. 10 in high temperature. In FIG. 10 and FIG. 11, in case where the elongate conductive layer 8 is formed on an insulation film having relatively soft and low Young's modulus material, the conductive layer 8 tends to easily expand relative to the length of the wiring in the subsequent high temperature processing steps such as forming an upper layer insulation film, curing or the like. Opening portions are normally formed at end portions of the conductive layers for making electrical connection with the underlying wiring. If it is designed to apply a fixed potential, thereby not flowing a large current through the opening, only one opening portion is formed. Accordingly, the upper section of the opening portion 7 is stretched in the direction of the longer length of the third conductive layer 8 when it expands by thermal expansion, thereby peeling the less closely attached connection portion, i.e., at the interface between the bottom portion of the connection hole 7 and the lower wiring layer (namely, the first conductive layer 3 and the second conductive layer 4 in FIG. 10 and FIG. 11). This means that the connection hole 7 becomes an electrically isolated conductive layer 20. As described above, in the related art, since deformation, disconnection or the like occurs at connection portions between particularly fragile wiring, it is most likely that production yield and wiring reliability are largely affected.

In consideration of the above circumstances, the present invention provides a semiconductor that enables to suppress deformation of the opening portions due to thermal expansion and contraction and to improve production yield and reliability wiring, and a method of fabricating such semiconductor device.

In order to address the above, the semiconductor device according to the present invention includes a substrate, a first conductive layer formed on the substrate, a second conductive layer formed on the substrate at a predetermined distance from the first conductive layer, an insulation film formed on the upper surfaces of the first conductive layer and the second conductive layer and having a plurality of first opening portions to expose either the first conductive layer or the second conductive layer and second opening portions to expose neither the first conductive layer nor the second conductive layer, and a third conductive layer formed on the upper surface of the insulation film in such a manner to fill up the first opening portions and the second opening portions and to make electrical connection with the first conductive layer and the second conductive layer by way of the first opening portions, wherein the second opening portions are formed between a pair of the first opening portions along the third conductive layer.

In the semiconductor device according to the present invention as defined hereinabove, the second opening portions are formed between a pair of the first opening portions along the third conductive layer, thereby dispersing any force to be applied to the first opening portions and suppressing any deformation of the first opening portions which are the connection portions between the third conductive layer and either the first conductive layer or the second conductive layer.

The semiconductor device according to the present invention includes a substrate, a first conductive layer formed on the substrate, a second conductive layer formed on the substrate at a predetermined distance from the first conductive layer, an insulation film formed on the upper surfaces of the first conductive layer and the second conductive layer and having opening portions to expose either the first conductive layer or the second conductive layer, and a third conductive layer formed on the upper surface of the insulation film in such a manner to fill up the opening portions and to make electrical connection with the first conductive layer and the second conductive layer, wherein the third conductive layer has a predetermined wiring length to maintain electrical connection even if the length in the direction of the longer length is thermally expanded or contracted and also makes electrical connection with the first conductive layer and the second conductive layer by way of the opening portions.

In the semiconductor device as defined hereinabove, third conductive layers has a predetermined wiring length so that electrical connection with the first conductive layers and the second conductive layers is maintained by way of the opening portions even if the length in the direction of the longer length thermally expanded or contracted.

A method of fabricating a semiconductor device according to the present invention includes the steps of: forming a first conductive layer on a substrate; forming a second conductive layer on the substrate at a predetermined distance from the first conductive layer; forming an insulation film on the upper surfaces of the first conductive layer and the second conductive layer; forming in the insulation film a plurality of first opening portions to expose either the first conductive layer or the second conductive layer and second opening portions to expose neither the first conductive layer nor the second conductive layer; and forming a third conductive layer on the upper surface of the insulation film in such a manner to fill up the first opening portions and the second opening portions and to make electrical connection with the first conductive layer and the second conductive layer; wherein the second opening portions is formed between a pair of the first opening portions along the third conductive layer.

In the method of fabricating the semiconductor device according to the present invention, the first conductive layer is formed on the substrate and the second conductive layer is formed on the substrate at a predetermined distance from the first conductive layer. The insulation film is formed on the upper surfaces of the first conductive layer and the second conductive layer and is formed with a plurality of the first opening portions to expose either the first conductive layer or the second conductive layer and second opening portions to expose neither the first conductive layer nor the second conductive layer. The third conductive layer is formed on the upper surface of the insulation film to fill up the first opening portions and the second opening portions and to make electrical connection with the first conductive layer and the second conductive layer by way of the first opening portions. It is to be noted that the second opening portions are formed between a pair of the first opening portions along the third conductive layer.

A method of fabricating a semiconductor device according to the present invention includes the steps of: forming a first conductive layer on a substrate; forming a second conductive layer on the substrate at a predetermined distance from the first conductive layer; forming an insulation film on the upper surfaces of the first conductive layer and the second conductive layer; forming opening portions in the insulation film to expose either one end of the first conductive layers or of the second conductive layer; and forming a third conductive layer on the upper surface of the insulation film to fill up the opening portions and to make electrical connection with the first conductive layers and the second conductive layers; wherein the wiring length of the third conductive layer is made to a predetermined length to maintain connection even if the length in the direction of the longer length may vary due to thermal expansion or contraction and the third conductive layer makes electrical connection with the first conductive layers and the second conductive layers by way of the opening portions at both ends of the third conductive layer.

In the method of fabricating the semiconductor device according to the present invention, the first conductive layer is formed on the substrate and the second conductive layer is formed on the substrate at a predetermined distance from the first conductive layer. The insulation film is formed on the upper surfaces of the first conductive layer and the second conductive layer and the opening portions are formed in the insulation film to expose end portion of either the first conductive layer or the second conductive layer. The third conductive layer is formed on the upper surface of the insulation film to fill up the opening portions and to make electrical connection with the first conductive layer and the second conductive layer. It is to be noted that the third conductive layer has a predetermined wiring length to maintain electrical connection even if the length in the direction of the longer length may vary due to thermal expansion or contraction and the third conductive layer makes electrical connection with the first conductive layer and the second conductive layer by way of the opening portions at both end portions of the third conductive layer.

The semiconductor device according to the present invention is possible to suppress deformation at the opening portions due to thermal expansion and contraction of the conductive layers, thereby improving production yield and wiring reliability. Also, the method of fabricating the semiconductor device according to the present invention is possible to suppress deformation at the opening portions due to thermal expansion and contraction of the conductive layers, thereby improving production yield and wiring reliability.

DESCRIPTION OF PREFERRED EMBODIMENTS

Next, preferred embodiments of the present invention will be described here under in greater detail by reference to the accompanying drawings.

First Embodiment

Figure 1:
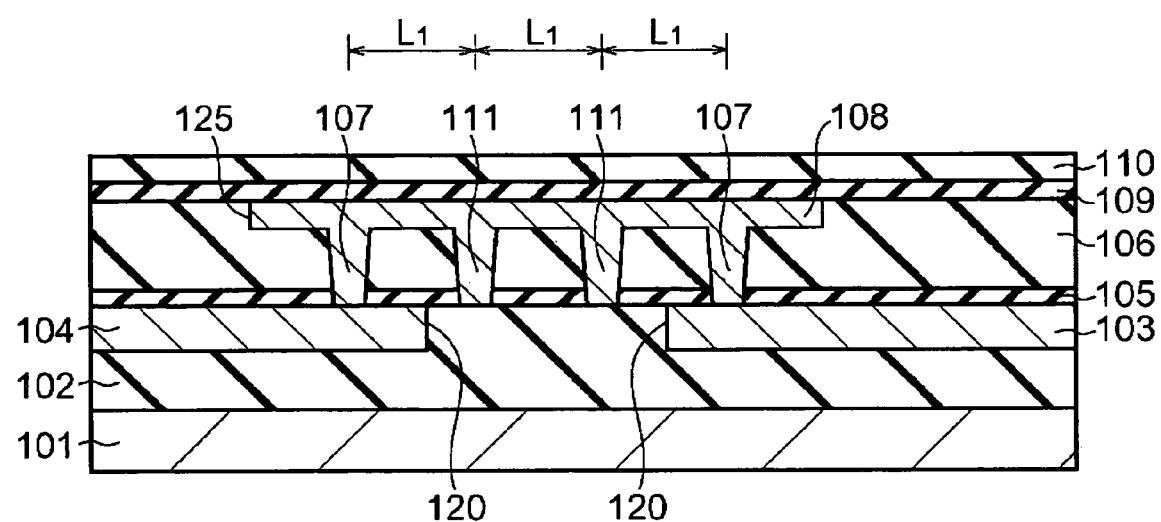
FIG. 1 is a diagrammatic cross section view of a part of a semiconductor device according to a first embodiment of the present invention.

Next, a first embodiment of the present invention will be described by reference to FIG. 1. FIG. 1 is a diagrammatic cross section view of the semiconductor device according to the present embodiment of the present invention. An insulation film 102 is formed on a substrate 101. Wiring grooves 120 are formed in parts of the upper surfaces of the insulation film 102, and a first conductive layer 103 and a second conductive layer 104 made from, for example, Cu (i.e., copper) are formed in the wiring grooves 120 at a predetermined distance from each other. A diffusion protection film 105 is formed in such a manner to cover the first conductive layer 103 and the second conductive layer 104. Formed on the upper surface of the diffusion protection film 105 is an insulation layer 106 made from, for example, allyl ether resin having low Young's modulus. A wiring groove 125 is formed on the upper surface of the insulation film 106 in which a third conductive layer 108 made from, for example, Cu is formed. A diffusion protection film 109 and an insulation film 110 are sequentially formed on the upper surface of the insulation film 106 on which the third conductive layer 108 is formed. Also formed in the insulation film 106 is a plurality of first opening portions 107 in such a manner to expose either the first conductive layer 103 or the second conductive layer 104. The first conductive layer 103 and the second conductive layer 104 are electrically connected to the third conductive layer 108 by way of the first opening portions 107. Furthermore, second opening portions 111 are formed at a predetermined distance $L_1$, between the pair of the first opening portions 107 along the third conductive layer 108 in such a manner not to expose the first conductive layer 103 or the second conductive layer 104. It is to be noted that the first opening portions 107 and the second opening portions 111 are filled with the same conductive material as the third conductive layer 108. Note that device areas, device isolation areas and the like which are formed in or on the substrate are not shown in the drawing for convenience.

Figure 2A:
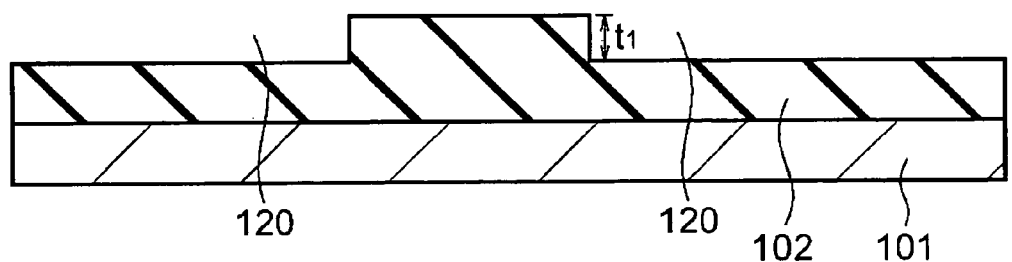
FIG. 2A is a diagrammatic cross section view sequentially illustrating major steps of fabricating the semiconductor device according to the first embodiment of the present invention, and 2B is a diagrammatic cross section view sequentially illustrating major steps of fabricating the semiconductor device according to the first embodiment of the present invention.

Next, a method of fabricating the semiconductor device according to the present invention will be described here under by reference to FIG. 2-FIG. 6. FIG. 2-FIG. 6 are diagrammatic cross section views sequentially illustrating major steps of fabricating the semiconductor device according to the present invention. As shown in FIG. 2A, the insulation film 102 is formed on the upper surface of the semiconductor substrate 101 in which a certain device area is formed. On the upper surface of the insulation film 102, wiring grooves 120 having the depth $t_1$ are formed at, for example, two positions in the conductive layer forming area at a predetermined distance from each other by the existing lithography process, etching process or the like. In the present embodiment, the depth $t_1$, is approximately 200 nm.

Figure 2B:
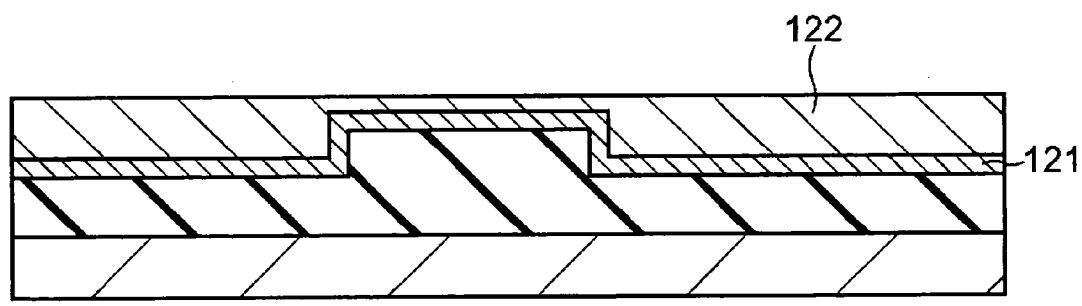

The insulation film 102 is made from, for example, allyl ether resin. Subsequently, as shown in FIG. 2B, a barrier metal 121 is formed on the upper surface of the insulation film 102 having the wiring grooves 120 formed therein and then a first metal layer 122 is formed on the barrier metal 121. The barrier metal 121 is made from, for example, a tantalum (Ta) film of approximately 10 nm in thickness by sputtering process. On the other hand, the first metal layer 122 is made from an approximately 80 nm Cu seed film and approximately 700 nm Cu plating layer by electrolytic plating process.

Figure 3A:
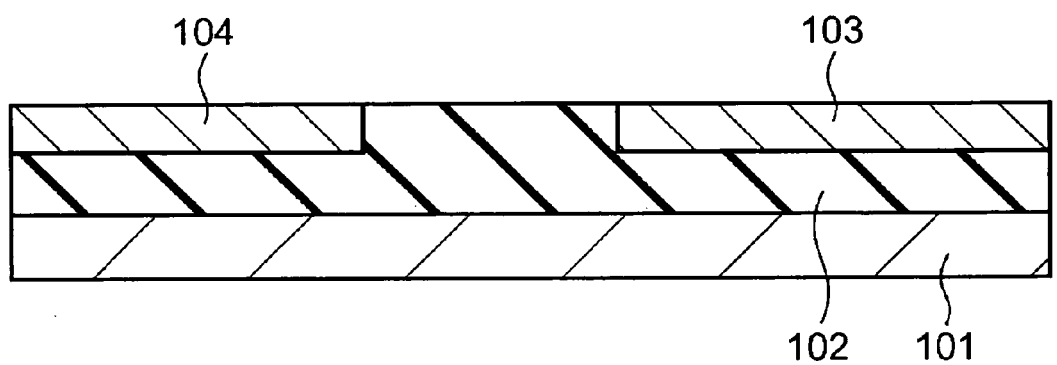
FIG. 3A is a diagrammatic cross section view sequentially illustrating major steps of fabricating the semiconductor device according to the first embodiment of the present invention and 3B is a diagrammatic cross section view sequentially illustrating major steps of fabricating the semiconductor device according to the first embodiment of the present invention.
Figure 3B:
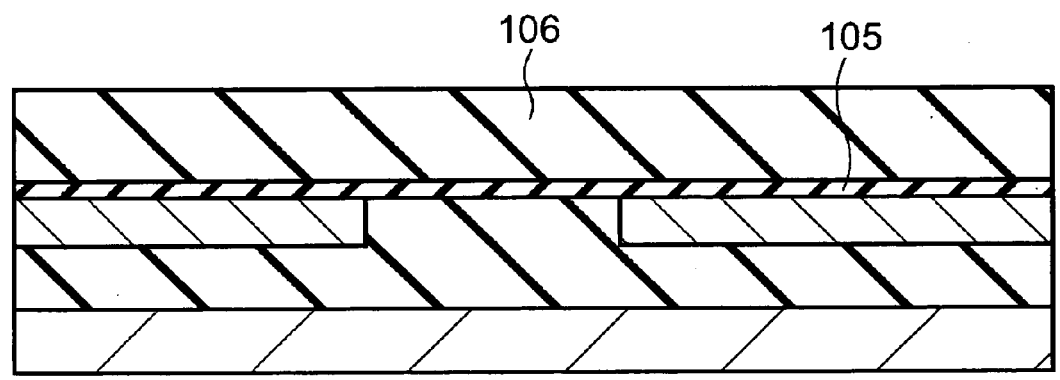

Then, as shown in FIG. 3A, the first metal layer 122 is polished by CMP (Chemical-Mechanical Polishing) process or the like until the insulation film 102 is exposed, thereby forming the first conductive layer 103 and the second conductive layer 104 in the wiring grooves 120. In the present embodiment, the first conductive layer 103 and the second conductive layer 104 are made from the same metal layer 122 but maybe made from different metal layers. It is to be noted that the barrier metal is omitted in FIG. 3A and the subsequent drawings. Subsequently, as shown in FIG. 3B, an approximately 50 nm thick SiC film is formed as the diffusion protection film 105 to prevent Cu from diffusing and also an approximately 600 nm thick insulation film 106 made from allyl ether resin or the like having a lower Young's modulus than the $SiO_2$ film is formed. The diffusion protection film 105 and the insulation film 106 are formed by choosing appropriate process depending on the materials used therefor.

Figure 4A:
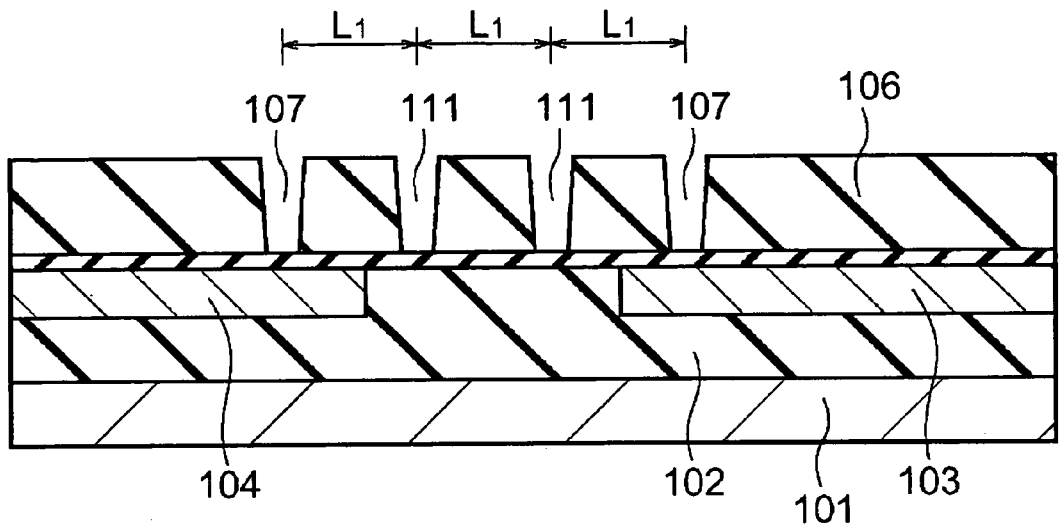
FIG. 4A is a diagrammatic cross section view sequentially illustrating major steps of fabricating the semiconductor device according to the first embodiment of the present invention and 4B is a diagrammatic cross section view sequentially illustrating major steps of fabricating the semiconductor device according to the first embodiment of the present invention.
Figure 4B:
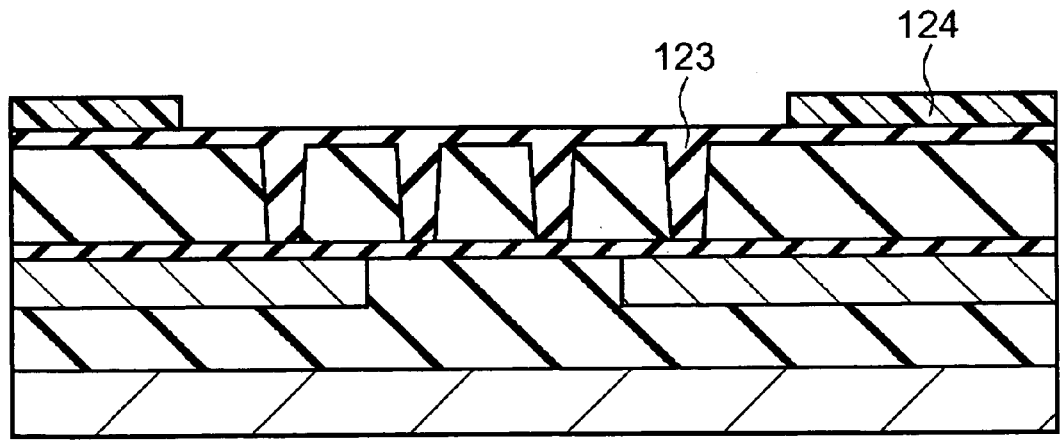

Then, as shown in FIG. 4A, the first opening portions 107 are formed in the insulation film 106 at the positions corresponding to end portions of the first conductive layer 103 and the second conductive layer 104 by the existing lithography process and etching process. Simultaneously, the second opening portions 111 are formed between the first opening portions 107 at a predetermined distance $L_1$ in the area where the third conductive layer 108 is to be formed but excluding the areas where the first conductive layer 103 and the second conductive layer 104 are formed. It is preferable that the diffusion protection film remains at the bottom of the first opening portions 107 and the second opening portions 111. The distance $L_1$ for forming the second opening portions 111 is determined depending on such factors as the wiring length of the third conductive layer 108 which will be formed later, Young's modules and coefficients of thermal expansion of the third conductive layer 108 and the insulation film 106, heating temperature in subsequent process and the like. In the present embodiment, the second opening portions 111 are formed at every 100 μm in the wire length of the third conductive layer 108. Then, as shown in FIG. 4B, a buried layer 123 is formed on the upper surface of the insulation film 106 in such a manner to fill out the first opening portions 107 and the second opening portions 111. A resist film 124 is formed on the upper surface of the buried layer 123 and the resist film 124 is processed by the existing lithography process in a predetermined pattern at the area where the third conductive layer 108 is formed.

Figure 5A:
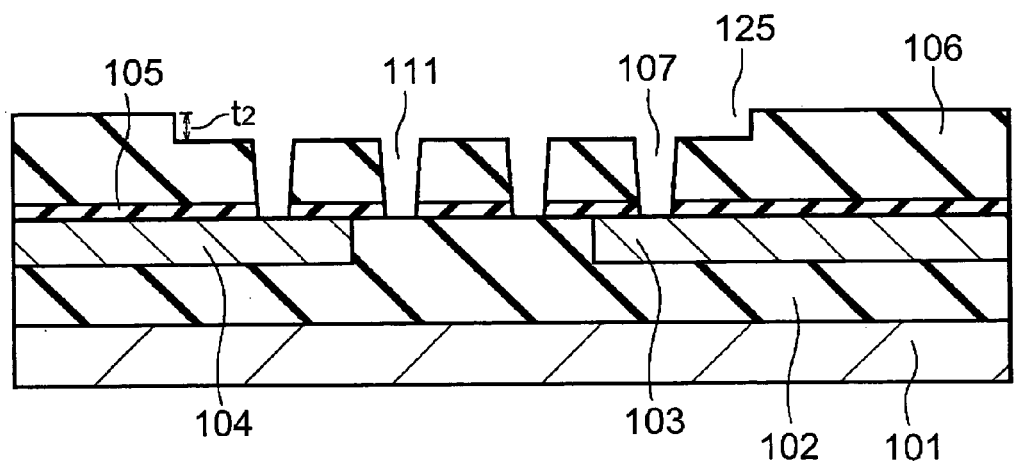
FIG. 5A is a diagrammatic cross section view sequentially illustrating major steps of fabricating the semiconductor device according to the first embodiment of the present invention and 5B is a diagrammatic cross section view sequentially illustrating major steps of fabricating the semiconductor device according to the first embodiment of the present invention.
Figure 5B:
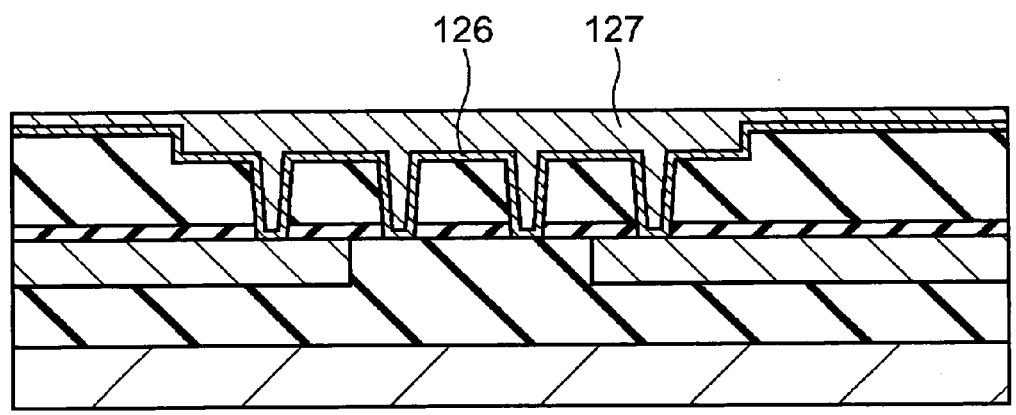

Next, referring to FIG. 5A, the buried layer 123 and the insulation film 106 excluding the area where the resist film 124 is formed are processed by the existing etching process. By removing the resist film 124 and the buried layer 123, a wiring groove 125 having the depth $t_2$ is formed. Furthermore, the diffusion protection film 105 which is exposed to the first opening portions 107 and the second opening portions 111 is removed by etching process or the like, thereby exposing the first conductive layer 103 and the second conductive layer 104 to the first opening portions 107 and similarly exposing the underlying insulation film 102 to the second opening portions 111. In this present embodiment, the depth $t_2$ of the wiring groove 125 is set to, for example, 300 nm. Then, referring to FIG. 5B, a barrier metal 126 and the second metal layer 127 are formed on the upper surface of the insulation film 106 in which the first opening portions 107, the second opening portions 111 and the wiring groove 125 are formed. The barrier metal 126 is formed from an approximately 20 nm thick Ta film by sputtering process. The second metal layer 127 is made from, for example, an approximately 80 nm thick Cu seed film and an approximately 800 nm thick Cu film by electrolytic plating process or the like.

Figure 6A:
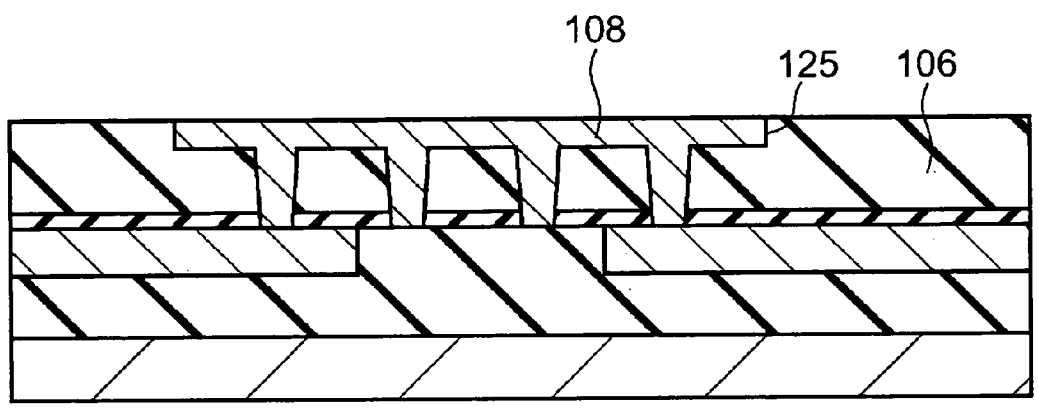
FIG. 6A is a diagrammatic cross section view sequentially illustrating major steps of fabricating the semiconductor device according to the first embodiment of the present invention and 6B is a diagrammatic cross section view sequentially illustrating major steps of fabricating the semiconductor device according to the first embodiment of the present invention.
Figure 6B:
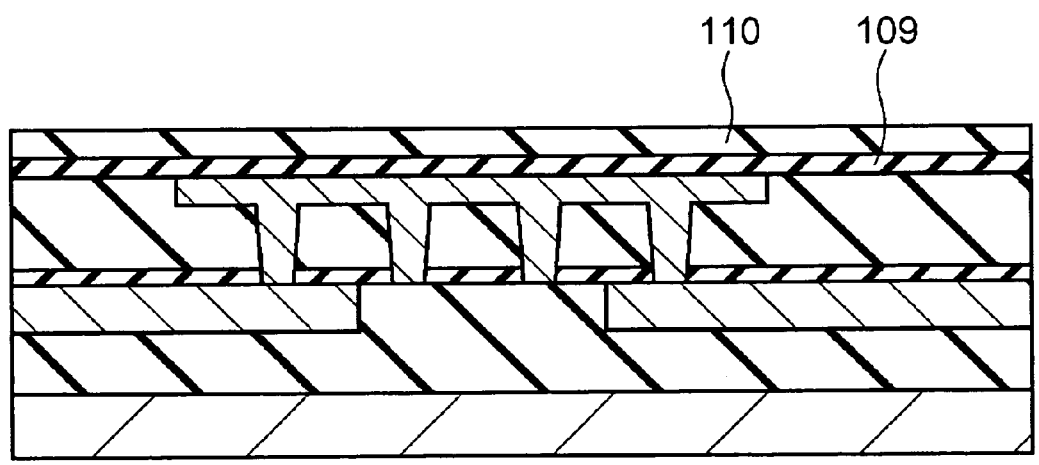

Subsequently, as shown in FIG. 6A, the second conductive layer 127 and the barrier metal 126 are polished by the CMP process to expose the insulation film 106 in order to form the third conductive layer 108 having the barrier metal 126 and the second metal layer 127 only in the wiring groove 125. The third conductive layer 108 is not restricted to the aforementioned material but may be any conductive material containing copper. It is to be noted that the barrier metal 126 is omitted in FIG. 6A and the subsequent drawings. Next, referring to FIG. 6B, forming the diffusion protection film 109 and the insulation film 110 in the similar process, and further forming a conductive layer if desired, thereby forming multilevel interconnection. It is to be noted that the distance $L_1$ and the number of the second opening portions 111 are not restricted to the aforementioned example but may vary depending on the film thickness of the conductive layers, dimensions of the opening portions, materials and film thickness of the insulation films, and the like. Also, the depth $t_1$, $t_2$ of the wiring grooves 120, 125 may be varied depending on materials and film thickness of the insulation films.

In the present embodiment, the second opening portions 111 are formed at every 100 μm between a pair of the first opening portions 107 which are formed in the third conductive layer 108. Allyl ether resin is used as the insulation film 106. And Cu is used as the conductive layers, or the upper layer (the third conductive layer 108) and the lower layer (the first and second conductive layers 103, 104). The third conductive layer 108 is connected to the lower layer wiring 103, 104 by way of the first opening portions 107 at both ends of the third conductive layer 108. Note that Young's modulus and coefficient of thermal expansion of Cu are 115 Gpa and 17.7 ppm/° C. while those of allyl ether resin are 2.45 Gpa and 66 ppm/° C., respectively. Assuming that the conductive layers 103, 104 and 108 are formed to have a wiring length of, for example, 1000 μm (repetitive configuration of a 1000 μm upper conductive layer 108 and 1000 μm lower conductive layers 103, 104) and the insulation film 106 which is made from allyl ether resin is formed between the upper and lower conductive layers. If the actual operating temperature is approximately 100° C., the aforementioned Young's modulus and coefficient of thermal expansion suggest that the wiring length expands approximately 800 nm per one end of the conductive layer. In other words, at the opening portions 107, an approximately 800 nm deforming force is applied from the lower conductive layers 103, 104 in one direction and similarly an approximately 800 nm deforming force is applied from the upper conductive layer in the opposite direction.

In view of the 130 nm generation, since the diameter of the opening portions 107, 111 is approximately 200 nm, a force enabling to deform the diameter equal to approximately 400% in the wiring direction is applied from the upper and lower conductive layers, respectively, in the opposite directions. Accordingly, since the bottom portions of the first opening portions 107 and the underlying conductive layers 103, 104 are connected with insufficient adherence by way of the barrier metal and the like, it is easily understood that disconnection may occur. In case where the opening portions 107, 111 are formed in the third conductive layer 108, for example, at every 100 µm, a force deforms each end portion of the conductive layers 103, 104 and 108 approximately 80 nm (i.e., 40% of the diameter). This means that the force is suppressed equal to approximately ¹⁄₁₀ of the case where the second opening portions 111 are not formed. If the deformation is approximately 40% of the diameter, connection at the first opening portions 107 may be maintained. In the present embodiment, it is considered that 10% order or approximately 100 µm is the limit and the second opening portions 111 are formed at the distance $L_1$ so as to be less than the limit. If the second opening portions 111 are not formed like the design in the related art, the entire force to deform the connection portions due to the changes in the wiring length of the third conduction layer 108 is applied to the connection portions at the first opening portions 107. However, forming the plural second opening portions 111, which do not contribute electrical connection, between the plural first opening portions 107 along the third conductive layer 108 helps to disperse the force resulting from the change in the wiring length and to be applied to the first opening portions 107. The predetermined distance $L_1$ forming the first opening portions 107 and the second opening portions 111 is not restricted to the present embodiment and may be changed depending on the material and film thickness of the conductive layers, the diameter of the opening portions, and the material and film thickness of the insulation film.

In the present embodiment, the first conductive layer and the second conductive layer are electrically connected to the third conductive layer by way of the first opening portions and the second opening portions which do not contribute electrical connection are formed between the plural first opening portions at a predetermined distance along the third conductive layer. As a result, any change in the wiring length in the direction of the longer length of the third conductive layer due to thermal expansion or contraction in the subsequent fabrication steps is dispersed, thereby suppressing deformation of the first opening portions. Accordingly, it prevents peeling of the connection portions from the bottom of the first opening portions formed at both end portions of the third conductive layer which defines the connection portions of the conductive layers. Therefore, production yield and wiring reliability are improved.

Second Embodiment

Figure 7:
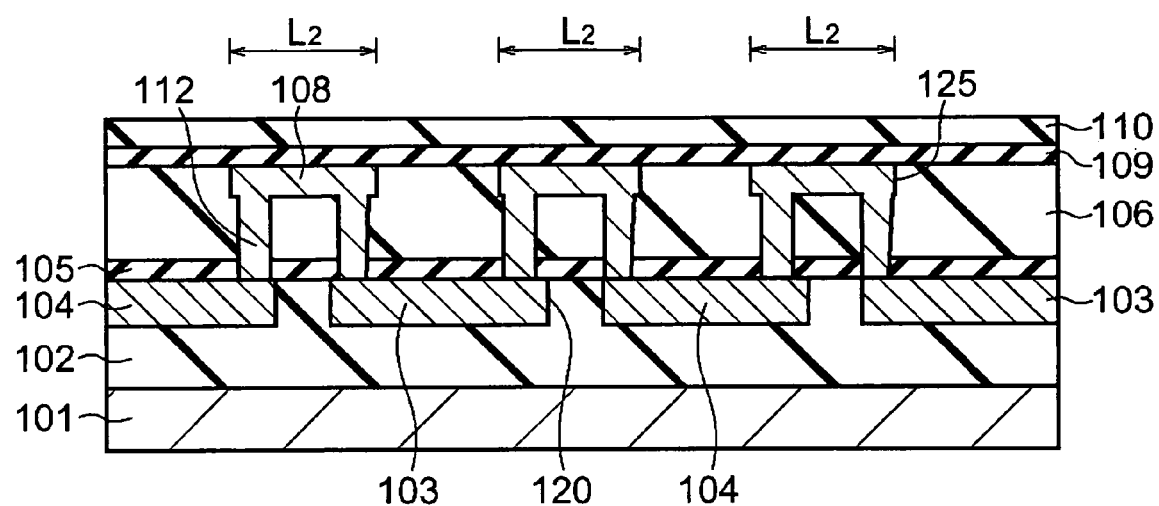
FIG. 7 is a diagrammatic cross section view of a part of the semiconductor device according to a second embodiment of the present invention.

Next, a fabrication method of a second embodiment of the semiconductor device according to the present invention will be described hereunder. It is to be noted that the same reference numerals as in the first embodiment are used to refer like elements, and no description will be given thereon and description will be made herein on only different portions. FIG. 7 is a diagrammatic cross section view of the semiconductor device according to the second embodiment of the present invention. An insulation film 102 is formed on the upper surface of the semiconductor substrate 101. A plurality of wiring grooves 120 is formed at parts on the upper surface of the insulation film 102 at a predetermined distance. Formed alternately in the wiring grooves 120 are a first conductive layer 103 and a second conductive layer 104 at a predetermined distance. The first conductive layers 103 and the second conductive layers 104 are made from, for example, Cu. A diffusion protection film 105 is formed in such a manner to cover the first conductive layers 103 and the second conductive layers 104. Formed on the upper surface of the diffusion protection film 105 is an insulation film 106 which is made from allyl ether resin or the like having low Young's modulus. Wiring grooves 125 are formed on the upper surface of the insulation film 106. A third conductive layers 108 each having a predetermined wiring length $L_2$ are formed in the wiring grooves 125. A diffusion protection film 109 and an insulation film 110 are sequentially formed on the upper surface of the insulation film 106 on which the third conductive layers 108 are formed. Incidentally, the third conductive layers 108 may be made from, for example, Cu. Each of the third conductive layers 108 having the wiring length $L_2$ is electrically connected to the first conductive layers 103 at one end thereof and to the second conductive layers 104 at the other end by way of the opening portions 112. The opening portions 112 are filled with the same material as the third conductive layers 108. It is to be noted that no device areas, device isolation areas and the like are shown in the drawing for simplifying the description.

Figure 8A:
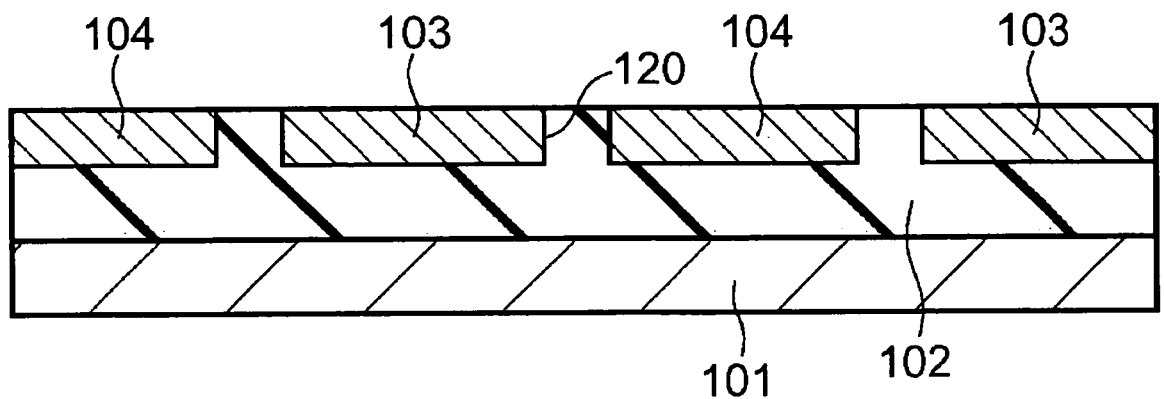
FIG. 8A is a diagrammatic cross section view sequentially illustrating major steps of fabricating the semiconductor device according to the second embodiment of the present invention and 8B is a diagrammatic cross section view sequentially illustrating major steps of fabricating the semiconductor device according to the second embodiment of the present invention.

Next, the method of fabricating the semiconductor device according to the present invention will be described hereunder by reference to FIG. 8 and FIG. 9. FIG. 8 and FIG. 9 show diagrammatic cross section views for sequentially illustrating major steps of fabricating the semiconductor device according to the present invention. As shown in FIG. 8A, the insulation film 102 is formed on the upper surface of the semiconductor substrate 101 at the location where a predetermined device area is defined. A plurality of wiring grooves 120 each having the depth of approximately 200 nm are formed at the conductive layer forming area on the upper surface of the insulation film 102 at a predetermined distance from each other by the existing lithography process, etching process and the like. A 10 nm thick Ta film is formed as a barrier metal on the upper surface of the insulation film 102 on which the wiring grooves 120 are formed. An 80 nm thick Cu seed film and a 700 nm thick Cu film are formed as a first metal layer on the upper surface of the barrier metal 121. Subsequently, the first metal layer is polished by the CMP process or the like until the insulation film 102 is exposed and the first conductive layers 103 and the second conductive layers 104 are formed in the wiring grooves 120. In this present embodiment, although the first conductive layers 103 and the second conductive layers 104 are made from the same metal layer, they may be made from different metal layers. It is to be noted that the barrier metal is not shown in the drawings and the first metal layer is shown as the first conductive layers 103 and the second conductive layers 104.

Figure 8B:
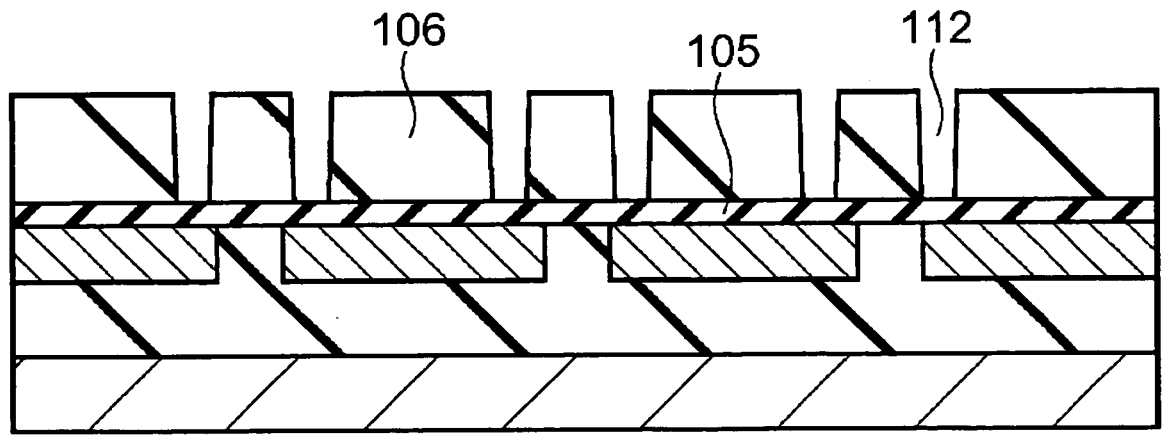

Then, as shown in FIG. 8B, a 50 nm thick SiC film is formed as a diffusion protection film 105 for preventing the first conductive layers 103 and the second conductive layers 104 from diffusing. And an insulation film 106 made from allyl ether resin or the like having low Young's modulus is formed to have a thickness of approximately 600 nm. An appropriate method is employed for forming the diffusion protection film 105 and the insulation film 106 depending on materials of these films. It is to be noted that these films may be omitted depending on materials of the diffusion protection film 105 and the conductive layers 103, 104. Subsequently, the opening portions 112 are formed in the insulation film 106 at end portions of each of the first conductive layers 103 and the second conductive layers 104 by the existing lithograph process and etching process. At this time, it is preferable that the diffusion protection film is left at the bottom of the opening portions 112.

Figure 9A:
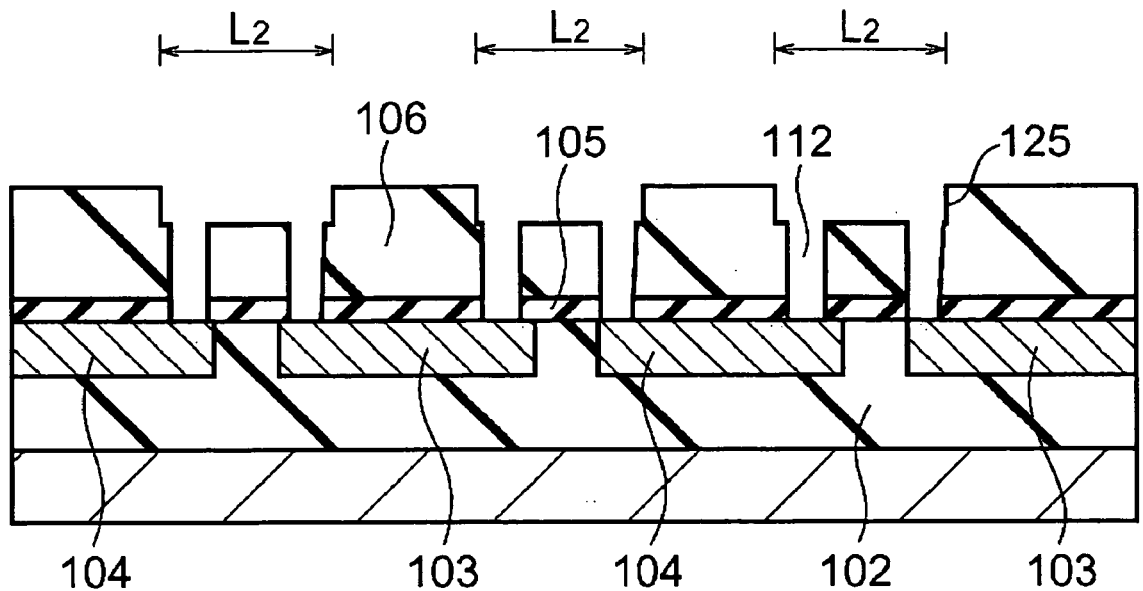
FIG. 9A is a diagrammatic cross section view sequentially illustrating major steps of fabricating the semiconductor device according to the present invention and 9B is a diagrammatic cross section view sequentially illustrating major steps of fabricating the semiconductor device according to the second embodiment of the present invention.

Subsequently, as shown in FIG. 9A, a buried layer is formed on the upper surface of the insulation film 106 in such a manner to fill up the opening portions 112. And a resist film is formed on the upper surface of the buried layer in a predetermined pattern to expose areas where the wiring grooves 125 are formed for the third conductive layers 108 by the existing lithography process. The buried layer and the resist film are omitted in the drawing. Then, the existing etching technique is used to process the buried layer and the insulation film 106 at the areas where the resist film is not formed. Subsequently, the resist film and the buried layer are removed to form approximately 300 nm deep wiring grooves 125 having the predetermined length $L_2$. Furthermore, the diffusion protection film 105 exposed to the opening portions 112 is removed by etching process or the like, thereby exposing the first conductive layers 103 and the second conductive layers 104.

Figure 9B:
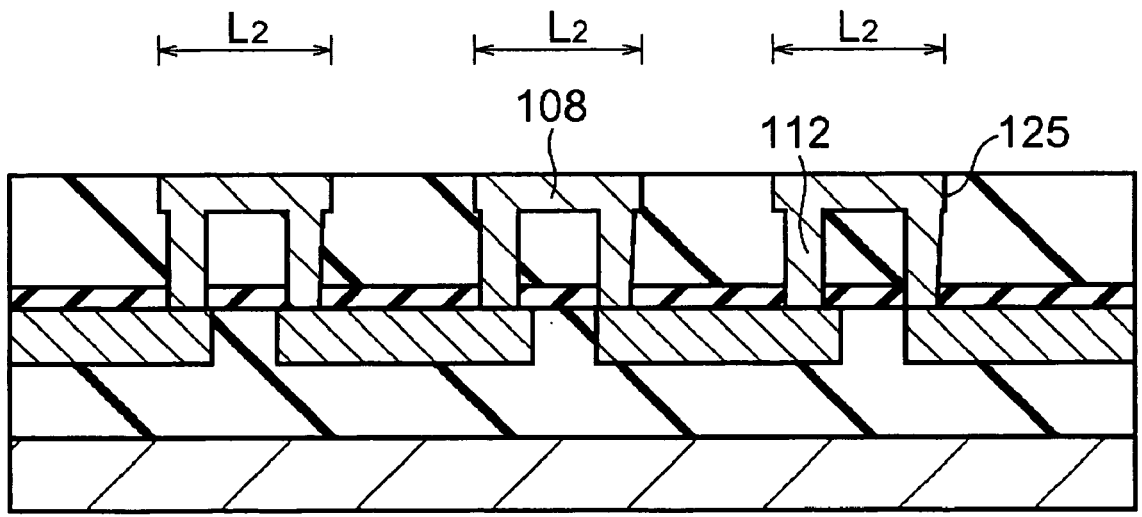
Figure 10:
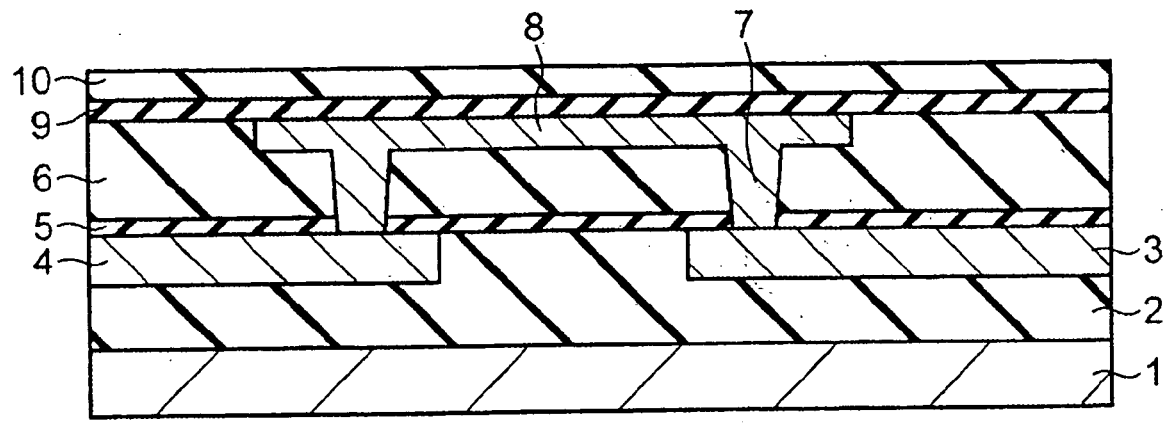
FIG. 10 is a diagrammatic cross section view of a part of a semiconductor device in the related art.
Figure 11:
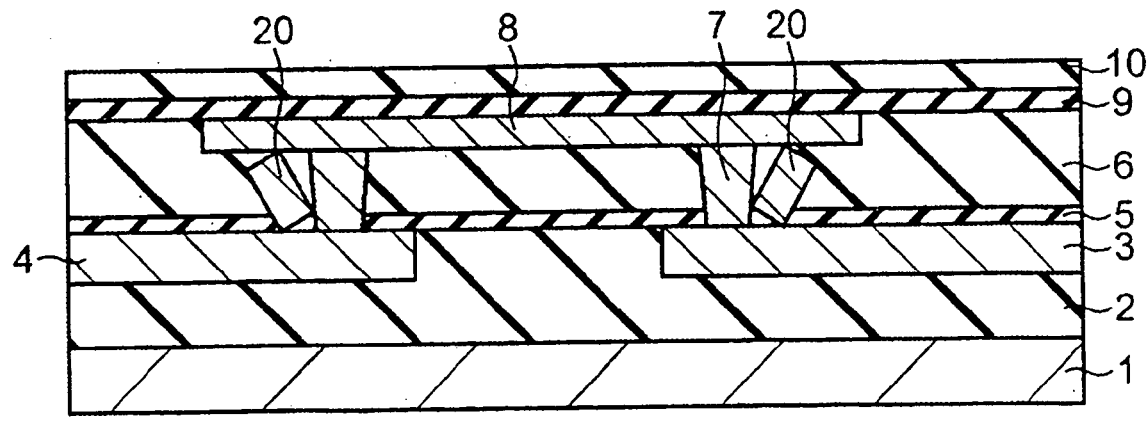
FIG. 11 is a diagrammatic cross section view of a part of a semiconductor device in the related art.

Subsequently, in FIG. 9B, an approximately 20 nm thick Ta film is formed as the barrier metal on the upper surface of the insulation film 106 where the opening portions 112 and the wiring grooves 125 are formed. Also formed is a metal layer which includes an approximately 80 nm thick Cu seed film and an approximately 800 nm thick Cu film. Polishing is performed by the CMP process or the like until the insulation film 106 is exposed, thereby forming the third conductive layers 108 each having a predetermined length $L_2$ in the wiring grooves 125. The material of the third conductive layers 108 is not limited to the one as described hereinabove but may be any other conductive material containing Cu. In the drawing, the barrier metal is omitted and the third conductive layers 108 are only shown as the second metal layer. Then, in the same process as described hereinabove, the diffusion protection film 109 and the insulation film 109 are formed. If necessary, conductive layers and the like are further formed to complete the multi-layer wiring as shown in FIG. 7.

In the present embodiment as shown in FIG. 7, the predetermined wiring length $L_2$ of the third conductive layers 108 is set to, for example, approximately 100 μm. Each of the third conductive layers 108 has a pair of opening portions 112 at both ends. One of the opening portions makes electrical connection with the first conductive layers 103 while the other opening portion makes electrical connection with the second conductive layers 104. In this configuration, the first conductive layers 103 are electrically connected to different third conductive layers 108 at the both ends thereof while the second conductive layers 104 are electrically connected to different third conductive layers 108 at both ends thereof. Such configuration may be repeated. It is to be noted that allyl ether resin is used as the insulation film 106 in which the opening portions 112 are formed for making connection between the third conductive layers 108 and the underlying first and second conductive layers 103, 104, wherein these conductive layers are made from Cu. At this time, Young's modulus and coefficient of thermal expansion of Cu are 115 Gpa and 17.7 ppm/° C. while those of allyl ether resin are 2.45 Gpa and 66 ppm/° C., respectively. For example, assuming that the wiring length $L_2$ of the conductive layers 103, 104 and 108 is approximately 1000 μm (repetitive configuration of 1000 μm long upper conductive layers and 1000 μm long lower conductive layers) and that the insulation film 106 made from allyl ether resin is formed between the upper conductive layer and the lower conductive layer. If the semiconductor device is actually used at the temperature of approximately 100° C., the aforementioned Young's modulus and coefficient of thermal expansion suggest that the end portions of the conductive layers expand approximately 800 nm per end. In other words, forces are applied from the lower conductive layers 103, 104 to the opening portions 112 to deform 800 nm in one direction and from the upper conductive layers 108 to deform 800 nm in the opposite direction.

In view of the 130 nm generation, since the diameter of the opening portions 112 is approximately 200 nm, a force enabling to deform the diameter equal to approximately 400% in the wiring length direction of the wiring, each in the opposite directions from the upper layer and the lower layer. Accordingly, since the opening portions 112 and the underlying conductive layers 103, 104 at the bottom portion of the opening portions 112 are connected with insufficient adherence by way of the barrier metal, it is easily understand that disconnection may occur. In the case where the wiring length $L_2$ of the third conductive layers 108 is set to, for example, 100 μm, a deforming force to be applied to each end of the conductive layers is only approximately 80 nm (i.e., 40% of the diameter), thereby reducing the force to approximately ¹/₁₀ of the case having the wiring length equal to 1000 μm. If the deformation is in the order of approximately 40% of the diameter, connection at the opening portions 112 may be maintained. In the present embodiment of the present invention, it is considered that 10% order or approximately 100 μm is the limit, so that the third conductive layers 108 are formed so as to have the wiring length $L_2$ equal to or less than such a limit. In case of making electrical connection by the opening portions at both ends of a long conductive layer like the design in the related art, the entire force to deform the connection portion due to thermal expansion of the conductive layer is applied to the opening portions, thereby increasing the possibility of peeling the connection portions. On the contrary, by forming the third conductive layers 108 each having a predetermined wiring length $L_2$ in such a manner to maintain the connection at the opening portions even if the conductive layer of the third conductive layers 108 may thermally expand or contract, the force to be applied to the opening portions caused by thermal expansion or contraction of the wiring length can be reduced.

It is to be noted that the wiring length $L_2$ of the third conductive layers 108 is not restricted to the present embodiment but may vary depending on the material and thickness of the conductive layers, the diameter of the opening portions and the material and film thickness of the insulation film. It is preferable that the wiring length of the first conductive layers 103 and the second conductive layers 104 is substantially equal to the wiring length $L_2$ of the third conductive layers 108 if the first conductive layers 103 and the second conductive layers 104 are made from the same material as the third conductive layers 108. Furthermore, if the wiring length is calculated from Young's modulus and coefficient of thermal expansion of the material forming the conductive layer of the first conductive layers 103 and the second conductive layers 104 in the same manner as the above, the force applied from the lower layer electrodes is further reduced.

In the present embodiment of the present invention, by restricting the wiring of the third conductive layers to a predetermined length, peeling of the connection portions due to change of the wiring length in the direction of the longer length resulting from thermal expansion or contraction is suppressed, thereby preventing deformation of the opening portions and maintaining the electrical connection.

As a result, production yield and wiring reliability of the semiconductor device are significantly improved.

It is to be noted that the present invention should not be restricted only to the above embodiments. For example, in the first embodiment, the distance of the second opening portions formed between the first opening portions can be changed depending on the thickness of the conductive layer, the diameter of the opening portions and the like. On the other hand, in the second embodiment, the wiring length of the third conductive layers may be changed depending on the thickness of the conductive layers and material of the insulation film. It is also understood that various other changes and modifications can be made without departing from the scope of the present invention.

What is claimed is:

1. A semiconductor device comprising:
   a substrate;
   a first insulation film formed on the substrate;
   a first conductive layer formed on the substrate with the first insulation film positioned between the substrate and the first conductive layer;
   a second conductive layer formed on the substrate at a predetermined distance from the first conductive layer;
   a diffusion protection film formed on upper surfaces of the first conductive layer, the second conductive layer, and the first insulation film, the diffusion protection film is made of SiC;
   a second insulation film formed on upper surfaces of the diffusion protection film, the first conductive layer and the second conductive layer and having a plurality of first opening portions to expose either the first conductive layer or the second conductive layer and one or more second opening portions to expose neither the first conductive layer nor the second conductive layer and expose the first insulation film; and
   a third conductive layer formed on an upper surface of the second insulation film in such a manner to fill up the first opening portions and the second opening portions for making electrical connection between the first conductive layer and the second conductive layer by way of the first opening portions;
   wherein,
   the second opening portions are formed between a pair of the first opening portions along the third conductive layer,
   the second insulation film is formed by a low dielectric constant material having a lower Young's modulus than that of a SiO2 film, and
   third opening portions are formed at predetermined distances of about 100 µm between each other and between the first and second opening portions along the length of the third conductive layer.

2. The semiconductor device of claim 1, wherein the third conductive layer is formed by a conductive material containing copper.

3. A semiconductor device comprising:
   a substrate;
   a first insulation film formed on the substrate;
   a first conductive layer formed on the substrate with the first insulation film positioned between the substrate and the first conductive layer;
   a second conductive layer formed on the substrate at a predetermined distance from the first conductive layer;
   a diffusion protection film is formed on upper surfaces of the first conductive layer, the second conductive layer, and the first insulation film, the diffusion protection film is made of Silicon Carbide (SiC);
   a second insulation film formed on upper surfaces of the diffusion protection film, the first conductive layer and the second conductive layer and having first opening portions to expose one end portion of the first conductive layer, second opening portions to expose one end portion of the second conductive layer, and third opening portions to expose a portion of the first insulation film located between the first and second conductive layers; and
   a third conductive layer formed on an upper surface of the second insulation film in such a manner to fill up the opening portions for making electrical connection between the first conductive layer and the second conductive layer;
   wherein,
   the third conductive layer has a predetermined wiring length to maintain the connection even if the length of the third conductive layer in a direction of longer length changes due to thermal expansion or contraction, and has the electrical connection between the first conductive layer and the second conductive layer at both ends of the third conductive layer by way of the first and second opening portions, and
   the second insulation film is formed by a low dielectric constant material having a lower Young's modulus than that of a SiO2 film, and
   the third opening portions are formed at predetermined distances of about 100 µm between each other and between the first and second opening portions along the length of the third conductive layer.

4. The semiconductor device of claim 3, wherein the third conductive layer is formed by a conductive material containing copper.

* * * * *